(12) United States Patent
Droz

(10) Patent No.: US 8,316,535 B2
(45) Date of Patent: Nov. 27, 2012

(54) ELECTRONIC DEVICE COMPRISING A VISIBLE ELECTRONIC ELEMENT CONNECTED TO AN INTERNAL MODULE AND MANUFACTURING PROCESS OF SUCH A DEVICE

(75) Inventor: Francois Droz, Corcelles (CH)

(73) Assignee: Nagraid SA, Le Cret-Du-Locle (CH)

( * ) Notice: Subject to any disclaimer, the term of this patent is extended or adjusted under 35 U.S.C. 154(b) by 220 days.

(21) Appl. No.: 12/656,518

(22) Filed: Feb. 2, 2010

(65) Prior Publication Data
US 2010/0177486 A1    Jul. 15, 2010

Related U.S. Application Data

(63) Continuation-in-part of application No. 10/529,774, filed as application No. PCT/IB03/04481 on Oct. 10, 2003, now Pat. No. 7,710,732.

(30) Foreign Application Priority Data

Oct. 11, 2002   (CH) ........................................ 1690/02

(51) Int. Cl.
    *H05K 3/30*   (2006.01)
(52) U.S. Cl. ............................... 29/841; 29/832; 29/846
(58) Field of Classification Search .................... 29/841, 29/832, 846
    See application file for complete search history.

(56) References Cited

U.S. PATENT DOCUMENTS

| | | | |
|---|---|---|---|
| 5,026,452 A | 6/1991 | Kodai | |
| 5,514,240 A | 5/1996 | Hagiiiri-Teiirani et al. | |
| 6,517,005 B1 * | 2/2003 | Ayala | 235/492 |
| 2002/0050527 A1 | 5/2002 | Nishikawa et al. | |
| 2005/0085005 A1 | 4/2005 | Droz | |

FOREIGN PATENT DOCUMENTS

| | | |
|---|---|---|
| EP | 1 085 459 A | 3/2001 |
| FR | 2 760 113 A | 8/1998 |
| JP | 62-290593 | 12/1987 |
| JP | 11-14494 | 5/1989 |
| JP | 03 114788 A | 8/1991 |
| JP | 05-208580 | 8/1993 |

OTHER PUBLICATIONS

Partial translation of JP 62-290593, Dec. 17, 1987.

* cited by examiner

Primary Examiner — Derris Banks
Assistant Examiner — Azm Parvez
(74) Attorney, Agent, or Firm — Harness, Dickey & Pierce, P.L.C.

(57) ABSTRACT

A method for manufacturing an electronic device and a device manufactured according to this method including an assembly of at least two insulating sheets, at least one electronic element, a first insulating sheet including at least one window in which the electronic element is at least partially lodged. One face of the electronic element flushes with the external surface of said first insulating sheet. The device may further include an internal module located between the two insulating sheets, a layer of filling material, an adhesive protection film extending over a region covering at least the outline of the window, said protection film being situated between the first insulating sheet and the layer of filling material covering the protection film and the internal module, conductive connection areas electrically linked to the internal module through an opening of the protection film and positioned on an internal face opposite to the external face of the electronic element. The adhesive protection film prevents the appearance of undesirable residues of filling material on the external face of the device in the vicinity of the electronic element.

40 Claims, 7 Drawing Sheets

ELECTRONIC DEVICE COMPRISING A VISIBLE ELECTRONIC ELEMENT CONNECTED TO AN INTERNAL MODULE AND MANUFACTURING PROCESS OF SUCH A DEVICE

CROSS REFERENCE TO RELATED APPLICATION

This application is a continuation-in-part of U.S. patent application Ser. No. 10/529,774 filed on Oct. 25, 2005 now U.S. Pat. No. 7,710,732 which is the national phase under 35 U.S.C. §371 of PCT application' which has an international filing date of Oct. 10, 2003 which designated the United States of America and which claims priority to Swiss patent application no. 2002-1690/02 filed on Oct. 11, 2002. The contents of each of the above applications are incorporated herein by reference.

BACKGROUND OF THE INVENTION

1. Field of the Invention

This invention belongs to the domain of electronic devices including an element visible on a face and the manufacturing methods of such a device. An electronic device is understood in the following description as an assembly formed by insulating layers in which at least an electronic element is incorporated. In particular the present invention concerns portable electronic devices, e.g. electronic cards or electronic tokens.

The present invention deals with a specific electronic device comprising a visible electronic element connected to an internal module. The visible element is defined here either as a fixed electronic component such as a visual display, a fingerprint sensor, a membrane switch, a contact module, a solar cell, a buzzer or any other similar element, or as a removable component such as a battery. This element can be connected to an internal module situated between two layers of insulating material that constitute the device faces.

The internal module situated inside the device is formed by one (such as an antenna) or several components connected to one another that serve to define the device functions. For example, in a device in the form of a payment card without contact, the internal module is formed by a chip or electronic circuit connected to an antenna. Furthermore, it can be connected to a display visible on one of the faces of the card allowing the visualization of data contained in the internal module such as the amount available or the debits carried out.

An electronic device of this type is generally made up of the arrangement of an internal module on or over a first sheet made from an insulating material and includes a window in which an electronic component is lodged. The internal module is then connected to the component and then, in general, coated or covered with a resin before laminating a second insulating sheet that will be stacked on the resin. The device manufactured in this way is a sandwich made up of at least two insulating sheets between which the internal module incorporated in a binder layer is arranged. The external face of the electronic component lodged in the window appears on one of the exterior faces of the device.

2. Description of the Prior Art

For example the document FR 2760113 describes a manufacturing method of a combined card that can function with or without contact. The element that maintains the contacts is placed in a cavity formed by a window cut out of a substrate and with a bottom made up of an adhesive sheet on which the substrate is placed. An antenna is connected to the element conductive areas, then the assembly is covered with a binder before the application of an insulating protection film. The adhesive sheet on the first face of the card is removed at the end of the manufacturing process thus allowing the appearance of the contacts on the card surface.

According to this method, various manufactured devices are rejected during the final control of production because they include residues of filling resin close to the window where the electronic component is situated. In fact, for example, when the outline of the window is larger than that of the component, the resin fills the space left between the outlines of the window and the component and thus the resin can spill out over the exterior face of the device. In other cases, the structure of the component can contain grooves which the resin can infiltrate by capillary effect and contaminate the device surface. This type of device is discarded, or otherwise a supplementary cleaning operation would be necessary to eliminate the binding residue.

When the contact element constitutes an autonomous component that is to say without connection to an antenna or to other components, it can be pressed in the profiled frame of a window formed in a substrate with a thickness at least equal to that of the component. The document JP03114788 describes a method for inserting a contact element in the substrate of a card that including a profiled window in such a way to hold the element on the surface of one of the faces of the card. The element is held in the window on the face opposite to the contacts by an insulating sheet provided with reliefs fitted onto the rear face of the element.

Another document EP1085459 describes a manufacturing method for a contact memory card where the contact element is inserted into a profiled frame formed in the first part of a substrate. A second flat substrate adhered to the first constitutes the bottom of a cavity delimited by the outline of the frame serving to support the contact element. The latter is inserted into the cavity in such a way that the contacts level the surface of the face of the first substrate.

SUMMARY OF THE INVENTION

The aim of this invention is to mitigate the above-mentioned drawbacks in order to reduce the rejection rate in production. Another aim is to minimise the manufacturing costs by increasing the speed of the process without adversely affecting the quality of the units.

The aim is achieved thanks to a method for manufacturing an electronic device comprising at least first and second insulating sheets having external and internal faces, at least one electronic element having an external face substantially flushing with the external face of said first insulating sheet and an internal module located between the two insulating sheets and connected to the electronic element, this method including:

placing at least the first insulating sheet including at least one window intended to lodge all or part of said electronic element;

inserting at least a part of the electronic element into said window of the first insulating sheet; the electronic element being provided with connection conductive areas positioned on an internal face opposite to the external face of the electronic element, stacking an adhesive protection film closing a region between the electronic element and the edges of said window, said adhesive protection film being coated or made up of an adhesive substance, placing an internal module on or over the first insulating sheet; said electronic element being connected to the internal module through a preformed opening in the adhesive protection film or an opening made during this step in the adhesive protection film, this opening facing the conductive connection areas, providing filling material on the intermediate assembly resulting from the preceding steps, stacking at least the second insulating sheet on or over the filing material, and pressing or laminating the assembly resulting from the preceding steps, the filling material forming a layer compensating the surface reliefs of said intermediate assembly.

The protection film can be activated either at room temperature (self-adhesive substance) or under the effect of heat and/or pressure. This protection film is later called adhesive film.

In a preferred variant, a function of the adhesive film is to hold the electronic element in the window during the handling of the assembly before proceeding to other manufacturing steps leading to the production of a completed device.

Depending on the thickness of the electronic element, it is sometimes necessary to stack several insulating sheets provided with windows in order to form a stack having approximately the same thickness as that of the electronic element. According to a particular embodiment, the adhesive film can be sufficiently deformable to be applied onto an electronic element thicker than the first insulating sheet. Supplementary insulating sheets can then be stacked on this assembly in order to compensate for the thickness of the electronic element.

Thus, according to the invention, the electronic device includes an internal module that is connected to the visible electronic element of this device. This internal module is preferably placed in a zone near the window containing the electronic element and is then connected to the electronic element. In a preferred embodiment, the filling material is then distributed over the protection film, the insulating sheet and over the internal module before the lamination with a second insulating sheet that covers the filing material.

The internal module may consist of any electronic unit, for example a chip working with the electronic element appearing on a face of the device or a battery for powering the electronic element.

A device assembled according to this method does not present any filling material residue visible on the face of the electronic element. The adhesive film blocks all leakage in the interstices present between the window edges and the electronic element.

According to the invention, the adhesive film includes a window or opening preformed or made when electrically connecting the electronic element with the internal module, this window or opening being located opposite the electrical contacts arranged on the interior face of the electronic element in such a way as to allow the soldering of this electrical contacts to the internal module. The window dimensions are preferably close to the surface area defined by the electrical contacts.

According to a variant, the first insulating sheet is provided with a cavity that will serve to place the internal module in position. In a case where the adhesive film extends across the entire surface of the first sheet, it would take the form of the cavity which would allow the placement of the internal module. This embodiment is, in general, carried out when the predetermined final thickness of the device must be respected in the case where the thickness of the internal module is more important.

This invention also has as an object an electronic device, that includes:

at least first and second insulating sheets and at least one electronic element, said first insulating sheet including at least one window in which the electronic element is at least partially lodged, one external face of said electronic element flushing with the external face of said first insulating sheet, an internal module located between the two insulating sheets, a layer of filling material, an adhesive protection film extending over a region covering at least the outline of said window of said first insulating sheet, said protection film being situated between the first insulating sheet and the layer of filling material covering the protection film and the internal module, conductive connection areas electrically linked to the internal module through an opening of the protection film and positioned on an internal face opposite to the external face of the electronic element, said conductive connection areas being part of said electronic element or in electrical contact with it.

A further object of the invention is a method for manufacturing an electronic device that includes:

placing at least a first insulating sheet including at least one window intended to lodge finally an electronic element;

inserting at least a part of an inert core into said window of the first insulating sheet;

stacking an adhesive protection film closing a region between the inert core and the edges of said window, said adhesive protection film being coated or made up of an adhesive substance, placing an internal module on or over said first insulating sheet, said internal module being electrically linked to conductive connection areas positioned on an internal face of the inert core, through a preformed opening of the adhesive protection film or an opening made in this protection film, providing filling material on the intermediate assembly resulting from the preceding steps, stacking at least a second insulating sheet on the filling material, pressing or laminating the assembly resulting from the preceding steps, the filling material forming a layer compensating the surface reliefs of said intermediate assembly, and removing the inert core from the window so that a cavity is provided, said cavity having a shape substantially corresponding to said electronic element and a bottom where the conductive connection areas are lying.

Thus, the electronic element visible on the surface of the device is replaced by an inert core in the device manufacturing process. Once the device is formed, the core is removed, leaving only a cavity with the form of the core previously inserted into the device. This cavity can be used for the subsequent insertion of a particularly fragile electronic component that could not withstand the temperature or the pressure of the lamination process during the manufacture of the device. The bottom of the cavity is preferably provided with contacts in the form of conductive surfaces connected to the internal module. In a variant, these contact conductive areas are arranged on the interior face of the core before the application of the adhesive film. They are held in the finished device by the filling material and/or the adhesive film and the connection with the internal module. Said cavity with electrical contacts allows, for example, the insertion of a battery, a display, a sensor or any other electrical element.

BRIEF DESCRIPTION OF THE DRAWINGS

The invention will be better understood thanks to the following detailed description which refers to the enclosed drawings which are given as a non-limitative example, in which.

DETAILED DESCRIPTION OF THE INVENTION

FIGS. 1 to 5 do not represent the complete device of the invention but several embodiments of pre-assemblies obtained by stacking insulating sheet(s), placing an element so that it flushes an external face of the device and an adhesive protection film.

Figure 1:
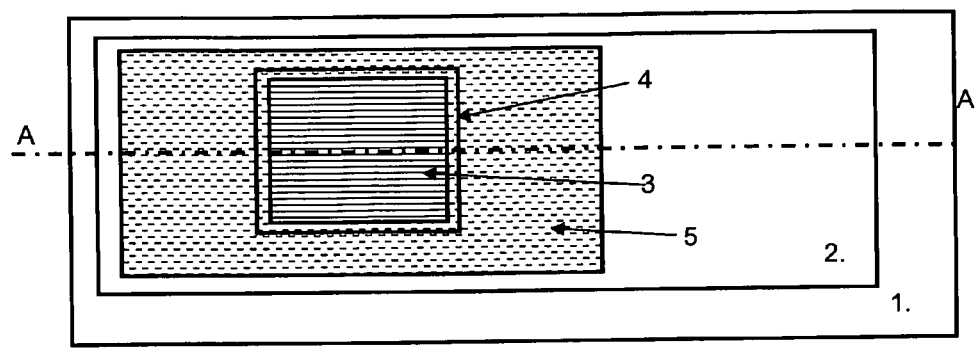
FIG. 1 represents a top view of a device with an electronic element or an inert core inserted in a window of an insulating sheet.

FIG. 1 shows a top view of an electronic device placed on a work surface (1) which includes an element (3) such as a display, a key, a contact module or also an inert core. The element is inserted into an opening or window (4) made in the insulating sheet (2) in plastic material, the outline of which is adapted to that of the element (3). The face of the element (3) in contact with the work surface is at approximately the same level as the exterior face of the device. An adhesive film (5) covers the window (4), the element (3) and an area of the insulating sheet (2) that extends around the window (2).

Figure 2:
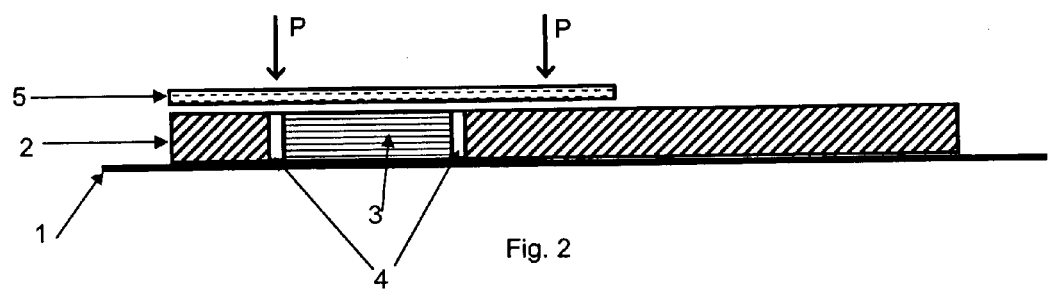
FIG. 2 represents a cross-section according to the A-A axis of the device in FIG. 1.

FIG. 2 represents a cross-section according to the A-A axis of the assembly in FIG. 1. The thickness of the insulating sheet (2) equals the thickness of the element (3) so as to obtain an approximately flat face after lamination by hot or cold pressing (P) the adhesive film (5).

Figure 3:
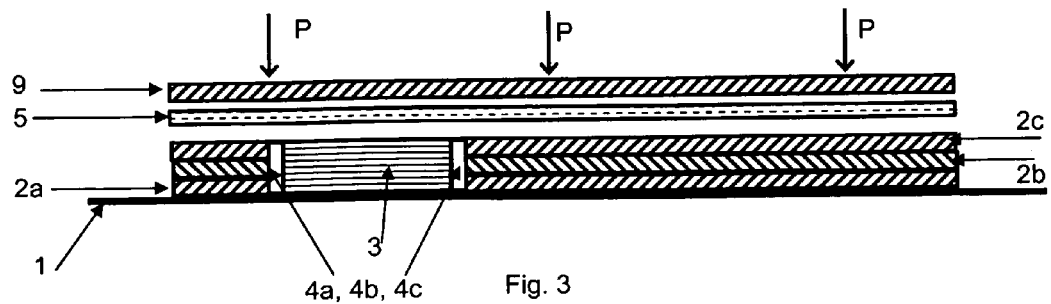
FIG. 3 shows a cross-section of an embodiment of the device in FIG. 1 with a stack of insulating sheets with a window.

According to an embodiment shown in FIG. 3, several insulating sheets (2a, 2b, 2c), each including a window (4a, 4b, 4c) can be stacked one on top of the other in order to obtain the desirable thickness according to that of the element (3). The outlines of the windows (4a, 4b, 4c) of each sheet (2a, 2b, 2c) coincide in such a way as to substantially adapt to the outline of the element (3). The first sheet with a window (2a) constituting the exterior face of the device can include decoration or a marking. The adhesive film (5) is then placed on the stack (2a, 2b, 2c) in such a way as to cover at least the outline of the window (4c) of the last sheet (2c) of the stack. The adhesive film (5) can also extend across the entire surface of the sheet (2c). A second exterior sheet (9) without a window can then be directly laminated onto the adhesive film (5) to constitute the second face of the device that can also include decoration.

Figure 4:
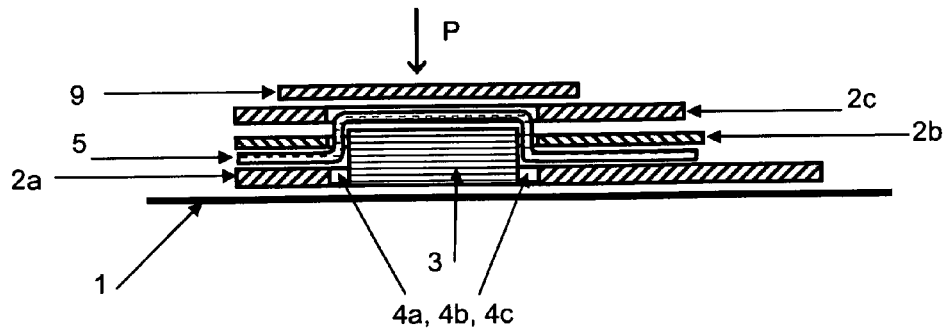
FIG. 4 shows a cross-section of a device embodiment in which supplementary sheets are stacked after the stacking of the adhesive film on the electronic element or inert core.

FIG. 4 represents an embodiment with an element (3) thicker than the first insulating sheet (2a). A flexible and deformable adhesive film (5) is placed on the element (3) in such as way to also extend over the peripheral area of the window (4a) of this first sheet (2a) where the element (3) is lodged. Then the supplementary sheets (2b, 2c), each provided with a window (4b, 4c) whose outline coincides with the outline of the window (4a) of the first sheet (2a), are stacked. The thickness of this assembly is approximately the same as the thickness of the element (3). Finally a last sheet (9) without a window constituting the second face of the device is assembled on the stack, covering at least the interior face of the element (3). In this example, the main function of the adhesive film is to hold the element in the window of the first sheet in order to facilitate handling. In fact, this first assembly comprising insulating sheet with window—element—adhesive film (2a, 3, 5) can be transported to another location where the finishing works will be carried out, this consisting in the assembly of the other sheets (2b, 2c, 9) of the device.

Figure 5:
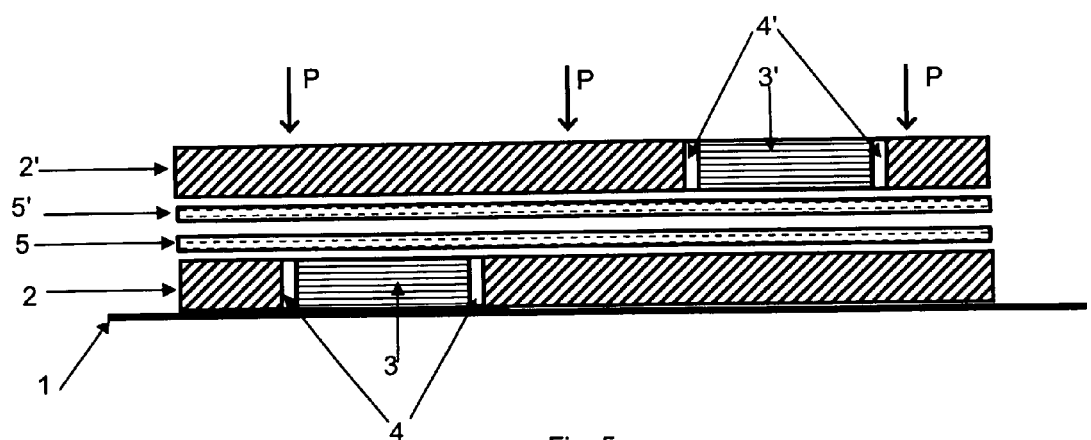
FIG. 5 shows a cross-section of a device that includes a visible electronic element on each face.

FIG. 5 shows a device whose faces are provided with a visible element (3, 3') obtained through stacking, then by assembling using the adhesion of two assemblies including insulating sheet with window—element—adhesive film (2, 3, 5, 2', 3', 5'), the faces of each assembly provided with adhesive film (5, 5') remaining in contact.

Figure 6:
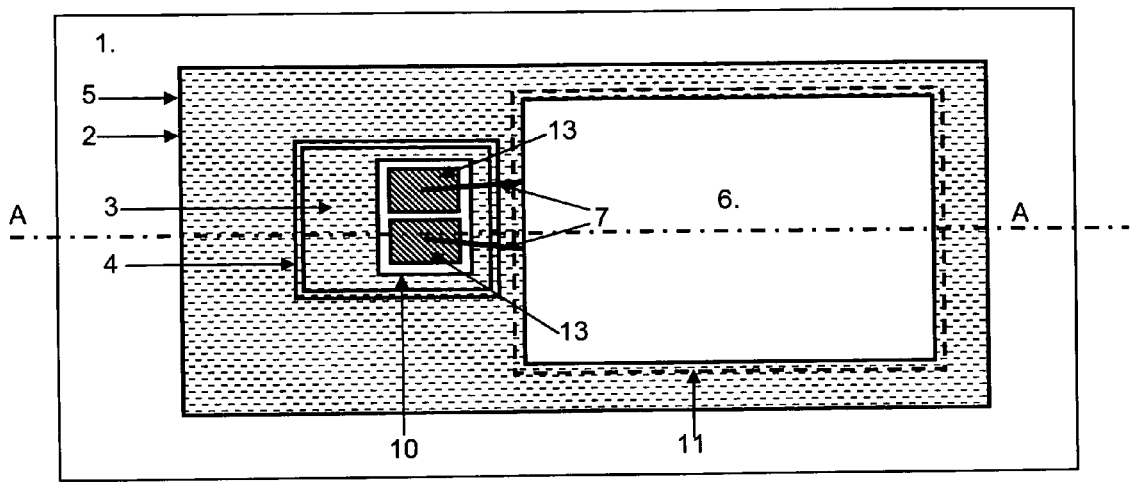
FIG. 6 represents a top view of a device according to the present invention, including an internal module and the application of a binder before applying a second insulating sheet and after having arranged an adhesive protection film including a window over the contacts areas of the electronic element.

FIG. 6 shows a view of the assembly of a device according to the present invention which includes an internal module (6) connected to the element (3); this internal module being e.g. an electronic circuit or unit. On the work surface (1), the first insulating sheet (2) includes a window (4) where the element (3) is lodged and is provided with two connection conductive areas (13) on its interior face. The exterior face of the element (3) like that of the insulating sheet (2) is in contact with the work table (1). The assembly formed by the element (3) and the insulating sheet (2) is entirely covered by the adhesive film (5) which is provided with a window (10) in the place where the connection conductive areas (13) of the element (3) are to be arranged. Therefore, these are released entirely to allow the soldering of the connections (7) originating from the internal module (6) placed on the adhesive film (5).

According to an embodiment where the element (3) is made up of an inert core, conductive connection areas are separately placed on the interior face of the element before the adhesive film (5) is applied. These areas are then connected to the internal module (6). When the device is completed, the core is removed and the bottom of the resultant cavity includes contacts. The latter allow the connection of an active component, of a similar form to the removed core, which will be subsequently inserted into the cavity. The component can either be removable like a battery, or fixed like a display, in the latter case it will be adhered and/or pressed into the cavity, the connections with the contacts being carried out by pressure or with a conductive adhesive for example.

According to another embodiment, the internal module (6) includes connections (7) that end on the internal face of the element (3) made up of an inert core so as to form contact areas on the bottom of the cavity when the core is removed.

Figure 7:
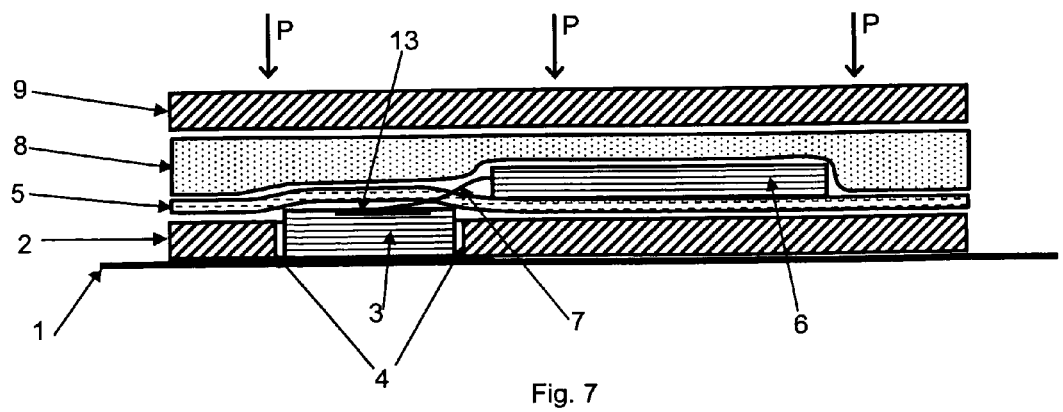
FIG. 7 represents a cross-section according to the A-A axis of an embodiment of the device without preformed window in the adhesive protection film.

The cross-section in FIG. 7 shows the stacking of the different elements of a device before pressing or lamination which are carried out according to the arrows P. The internal module (6) is placed on the adhesive film (5) close to the window (4) in order to facilitate its connection to the electronic element (3). This internal module (6) can also surround the electronic element (3) if it deals for example with an antenna of any type connected to a chip, the latter would be placed next to the electronic element. In other cases, parts of the internal module (6) can partially cover the electronic element (3) when for example the surface available becomes small due to the large exterior dimensions of the internal module (6) compared to those of the device. The position of the internal module (6) can be maintained by adhesion on the adhesive film (5). A layer of filling material (8) is then distributed over all or part of the surface of the adhesive film (5) and the internal module (6).

Filling material is understood to mean a substance in the form of a liquid or pasty resin, a thermo-fusible film or also a porous and flexible material that can be coated with an adhesive substance (foam, plastic material agglomerate). The function of said material is to fill in the holes and compensate the surface reliefs due to the assembly of the different elements of the device. According to its nature and its chemical composition this material is capable of solidifying, for example, under a cooling, heating or a UV radiation action.

Finally, a second insulating sheet (9) constituting the other face of the device is stacked and then pressed (P) onto the filling layer (8). Each of these insulating sheets (2, 9) can include a decoration on its exterior faces which also constitute the exterior faces of the device.

The adhesive film (5) has the main function of protecting the electronic element (3) and the window (4) against the undesirable penetration of filling material (8), and a secondary function of maintaining the position of the internal module (6) during the assembly of the device.

Figure 8:
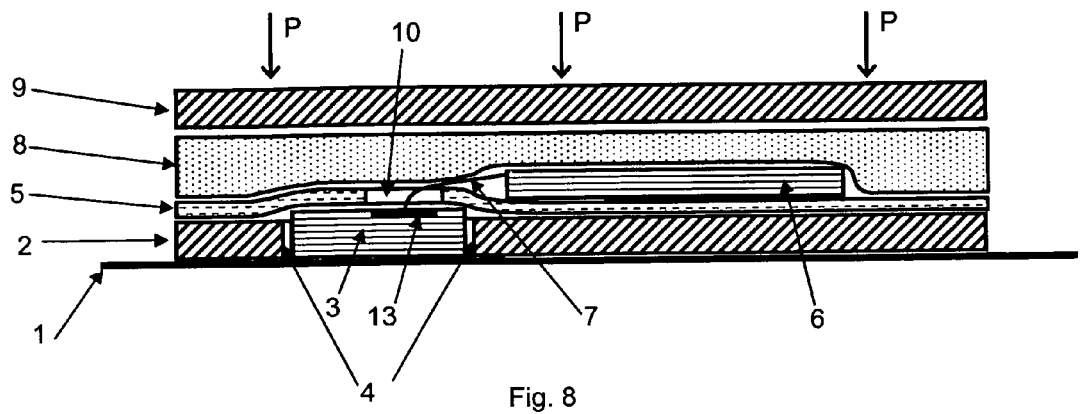
FIG. 8 shows a cross-section of the device in FIG. 6 with a preformed window in the adhesive protection film.

FIG. 8 shows an embodiment where the adhesive film (5) includes a window or opening (10) to be positioned opposite the conductive connection areas (13) of the electronic element (3). The outline of the window or opening (10) adapts to the outline of the areas of the interior face of the electronic element (3) occupied by the connection areas (13). For example, the outline of the window (10) can surround a group of several contacts or surround each contact area individually. The aim of this window (10) is to leave the connection areas (13) free of any substance that could impede the soldering of the connections (7) in order to connect the electronic element (3) to the internal module (6). The window (10) is formed in this case before the application of the adhesive film (5) onto the first insulating sheet (2) either by stamping or cutting, or by chemical etching.

According to the embodiment shown in FIG. 7 where the adhesive film (5) is without a window or opening, welding is possible because certain materials constituting the adhesive film (5) evaporate completely due to the heat of the soldering process without leaving deposits on the connection areas (13), thus forming an opening for the electrical connection means between the electronic element and the internal module.

Figure 9:
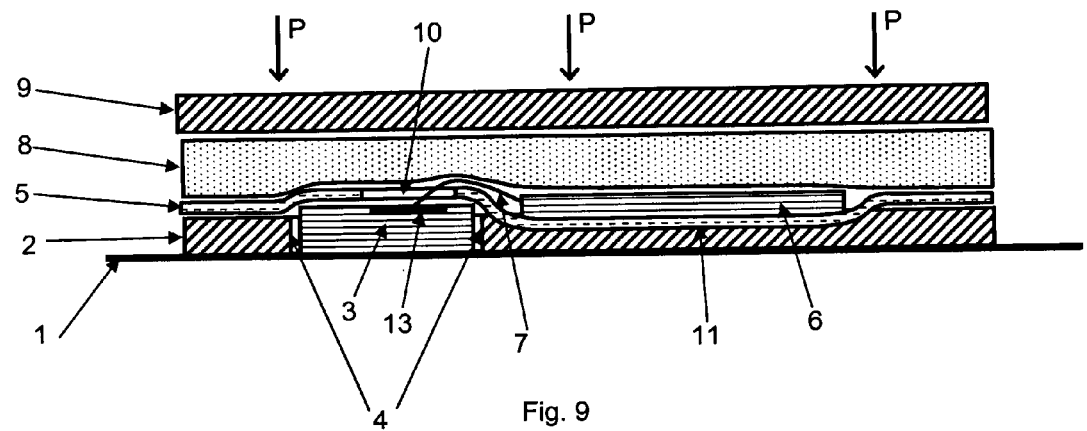
FIG. 9 shows a cross-section of an embodiment with a cavity in the first insulating sheet.

FIG. 9 shows an embodiment with a cavity (11) cut into the first insulating sheet (2), the outline of which adapts to that of the internal module (6). This cavity is in general milled before or after the formation of the window (4) destined to receive the electronic element (3). The depth of the cavity (11) depends on the thickness of the first sheet (2) and the thickness of the internal module (6) which will be placed and adhered onto the adhesive film (5) which covers the bottom of the cavity (11). The final thickness of a device can be imposed by the application standards or restrictions, the cavity (11) allowing the integration of a thicker internal module (6) in the device without exceeding the predetermined dimension.

The internal module (6) may be placed partially into the cavity (11) according to its shape and/or outline. For example, when the internal module includes one or several parts thicker than its average thickness, only these parts are fit in corresponding cavity or cavities while remaining part lays on the adhesive protection film (5) covering the first insulating sheet (2). The filling material (8) provided on the internal module (6) compensate remaining steps or bumps made up by the internal module (6) before stacking the second insulating sheet (9) forming an external face of the device.

The cavity (11) can also be formed by one opening or the stacking of openings in one or various intermediate sheets (2b, 2c) stacked then laminated onto the first sheet (2, 2a). Each of these sheets also includes a window (4, 4a, 4b, 4c) for the electronic element (3), see the example in FIG. 3.

According to an embodiment of the method of the invention, the adhesive film (5) can be placed in a first phase directly onto the work surface (1). The window or opening (10) intended to free the connection areas (13) of the electronic element (3) is then formed before placing in position the internal module (6). The assembly made up of the internal module (6) and the adhesive film (5) is then transferred to another location where the first insulating sheet (2) provided with the window (4) containing the electronic element (3) is applied. The steps for the connection of the electronic element (3) to the internal module (6), providing the filling material (8) and lamination of the second insulating sheet (9) are carried out in the same way as the process previously described. This embodiment of the method allows the increase of the production speed thanks to the simultaneity of the first steps. For example, the stamping of the window (4) and the milling of the cavity (11) in the first insulating sheet (2) as well as the placement of the electronic element (3) in the window (4) can be carried out at the same time as the stamping of the window (10) in the adhesive film (5) and the positioning of the internal module (6) on the film (5).

Figure 10:
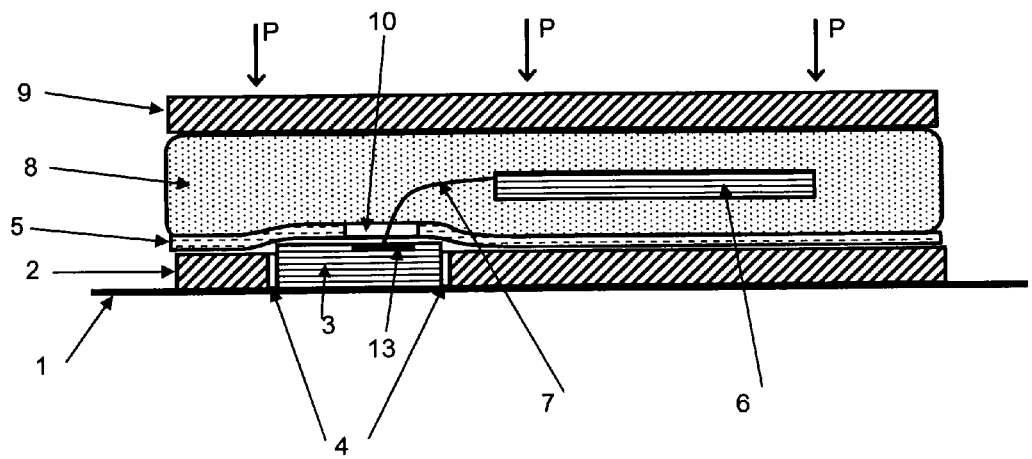
FIG. 10 shows an embodiment of the device where the internal module is completely embedded in filling material.

In the embodiment illustrated by FIG. 10, the internal module (6) is entirely embedded in the filling material (8) which is also arranged between the adhesive protection film (5) and the internal module (6).

The manufacturing of this embodiment requires placing and connecting the internal module (6) to the connection conductive areas (13) of the electronic element (3) before providing the filling material (8). In fact, if the filling material (8) is applied directly after stacking the adhesive protection film (5) over the electronic element lodged inside the window of the first insulating sheet it covers also the place where the electronic element should be connected to the internal module. In this case the connection is not possible without removing the surplus of filling material on the contacts face of the electronic element.

Figure 11:
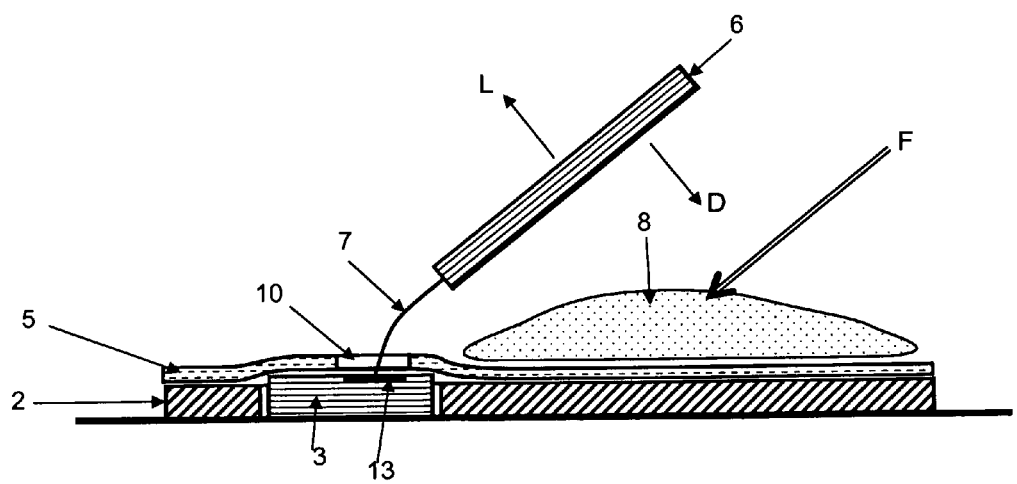
FIG. 11 shows a process step during which the internal module is lift up allowing providing filling material between the adhesive protection film and the internal module.

For more efficiency, it is preferable to place and connect in a first step the internal module to the conductive connection areas of the electronic element through the adhesive protection film and then in a second step, lift up (arrow L) the internal module as shown in FIG. 11. The filling material is then applied (arrow F) on the adhesive protection film under the internal module which is then put down (arrow D) to its definitive position. In a third step additional filling material may be applied on the whole surface of the assembly including the adhesive film and the internal module as in the embodiment illustrated by FIGS. 8 and 9.

Figure 12:
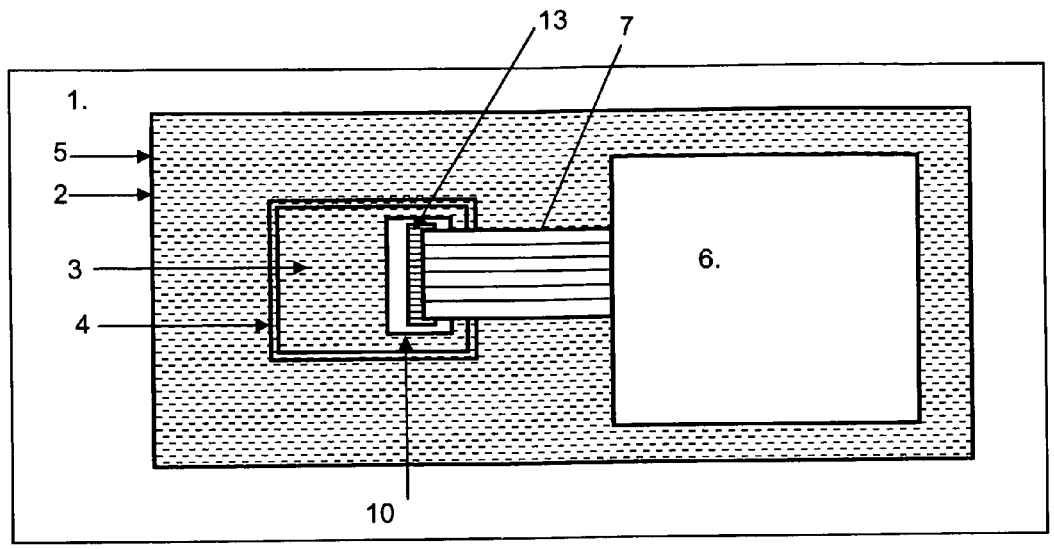
FIG. 12 shows a top view of an embodiment comprising an internal module connected to the electronic element with a flexible piece of flat ribbon cable or parallel conductive strips.

In order to be lift up sufficiently for filling material application, the internal module is preferably connected on a side directed towards to the electronic element as shown in the example of FIG. 12. A rocking motion of the internal module can thus be performed and filling material applied on the insulating sheet and/or the protection film where the internal module will then return.

The connection may be made up of a structure such as a flexible conductive contact strips, a piece of flexible printed circuit board, a piece of flat ribbon cable or any set of flexible conductive wires. A window (10) on the contact face of the electronic element allows appearing the contacts areas necessary for connecting the internal module. The electrical contact is then made e.g. by ultrasonic waves or laser soldering or with conductive glue depending on the size of the contacts and the required precision. In a further embodiment, the window (10) may be replaced by conductive vias (metal coated holes) traversing the adhesive film in such a way to be faced to the contacts areas of the electronic element.

Figure 13:
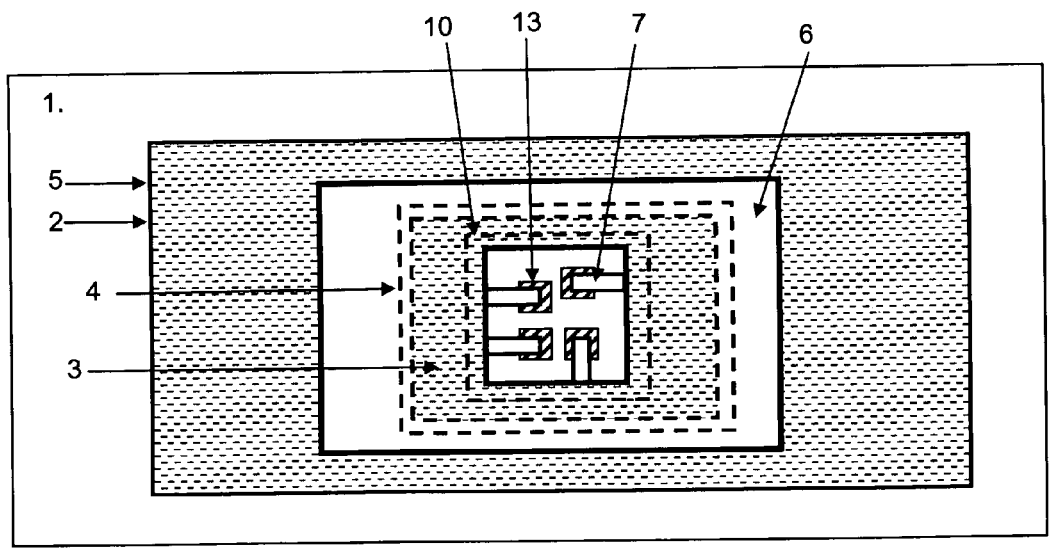
FIG. 13 shows a top view of an embodiment where the internal module surrounds the electronic element and includes contacts strips in a window as represented at FIG. 13.
Figure 13A:
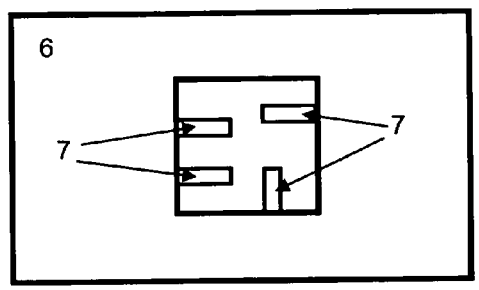

The internal module may have a configuration as represented at FIG. 13a with contact strips (7) placed in a window of the internal module. Such a type of internal module is placed on the adhesive film is such a way that the conductive areas of the electronic element appear in the window of the circuit and that the contacts strips are placed over the conductive areas ready to be connected. FIG. 13 shows a top view of an assembly including the first insulating sheet with a window containing the electronic element and covered with the adhesive protection film. The circuit as shown on FIG. 13a is placed and connected to the electronic element through an appropriate window in the adhesive film freeing the contact areas.

In this configuration where the circuit surrounds the contacts areas of the electronic element, the operation of providing filling material by lifting the circuit as in FIG. 11 is not possible without breaking the contact strips. The filling material can then be provided only after placing on the adhesive film and connecting the circuit to the electronic element as in the first embodiment of the method.

The element (3) as an electronic element or an inert core represented in the FIGS. 1 to 11 may have a more complex shape instead having a shape where the dimensions of the outline are constant on the whole thickness of the electronic element. In particular, the dimensions of its outline can vary proportionally to the thickness or height of the element. In such case, the electronic element may be considered as lodged partially in the window of the first insulating sheet since parts may be larger than the outline of the window. The dimensions of the outline of the windows of stacked insulating sheets are therefore adapted to the different dimensions of the element in function of its thickness or height. The cavity formed in the case of a removable inert core may thus have stepped walls according to the outlines of the superimposed windows.

Figure 14:
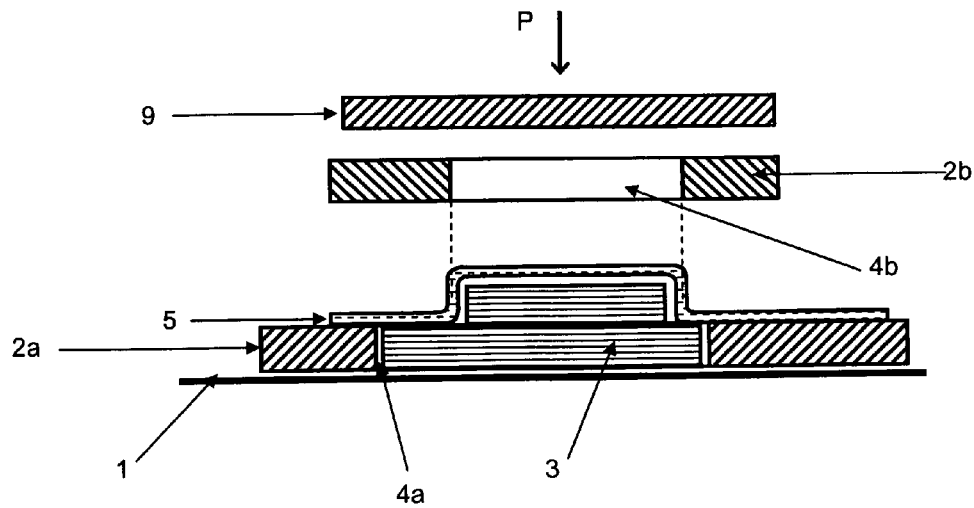
FIG. 14 shows a cross section of a device with an electronic element or inert core having two stages of different dimensions, the stacked insulating sheets include windows which outlines are adapted to the size of the electronic element stages.

FIG. 14 represents an example of a device with an electronic element (3) having two stages of different size. As the outline of the first stage inserted in the window (4a) of the first insulating sheet (2a) is larger than the outline of the second stage inserted in the window (4b) of the second insulating sheet (2b), the electronic element (3) may be a removable inert core. The thickness of the first sheet (2a) corresponds to the thickness of the first stage of the electronic element (3) while the thickness of the second stage corresponds to the thickness of the second insulating sheet (2b). After inserting the electronic element (3) in the window (4a) of the first insulating sheet (2a), the adhesive protection film (5) covers the electronic element (3) and extends at least over the outline of the window (4a) of the first insulating sheet (2a).

Figure 15:
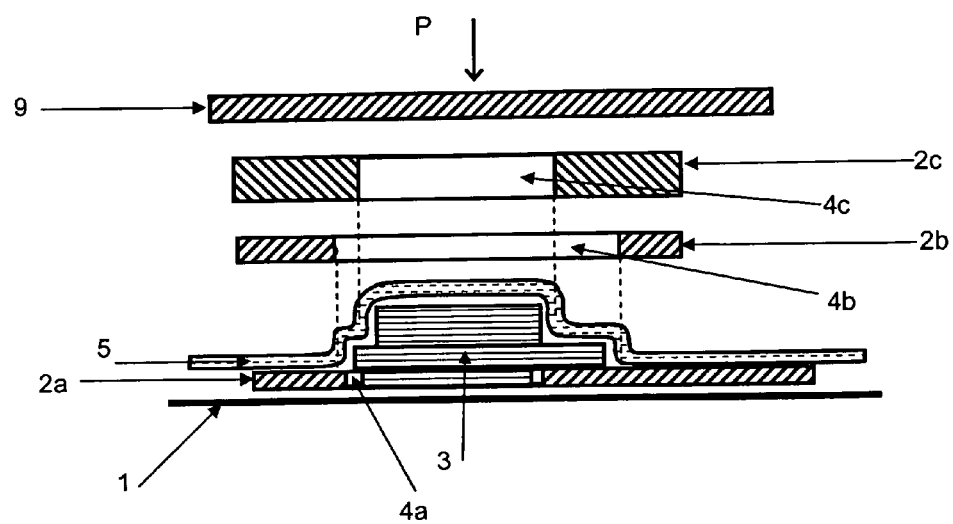
FIG. 15 shows a cross section of a device with an electronic element having three stages and insulating sheets with windows adapted to the outlines of each stage of the electronic element.

FIG. 15 shows a further example of a device with a three stages element (3) where the outline of the second stage is larger than the outlines of the first and third stage. In such a case, the element (3) cannot be removed and therefore preferably forms a fixed electronic element as for example a display, a fingerprint sensor, a keypad or any other unit requiring a face flushing an external face of the device. The insulating sheets 2a, 2b, 2c are provided each with a window respectively 4a, 4b and 4c which outline corresponds to each stage of the element (3). As in the example of FIG. 10, the adhesive protection film is placed after insertion of the element (3) into the window (4a) of the first insulating sheet 2a.

In the case of an inert core, the dimensions of its outline decrease proportionally to the thickness of the inert core so that it remains possible to remove the inert core from the electronic device. The dimensions of the outline of the internal face of the core are then smaller than the ones of the outline of the opposite face inserted in the window of the first insulating sheet. After removal of the core, the resulting cavity will have a bottom with a smaller outline than the one of the top edge corresponding to the window of the first insulating sheet.

In the aim to simplify FIGS. 14 and 15, the filling material (8), the internal module (6) and the conductive contact areas (13) provided, respectively assembled after stacking the adhesive protection film (5) as shown in FIGS. 6 to 9 are not represented.

In a further embodiment, the adhesive sheet may be placed on the last insulating sheet of the stack instead to be applied over the electronic and the first insulating sheet as shown by FIGS. 14 and 15. In other terms, the embodiment of FIG. 3 is also applicable with an element having a more complex shape and stacked sheets having each a window of different size.

The method of the invention in which a part of an electronic element is inserted into the window of the first sheet may comprise a further step of applying an additional transparent insulating sheet against the face of the electronic device including the flushing electronic element. This transparent sheet protect the surface of the electronic element which may a sensor, a photo-diode, a display, etc.

In a further embodiment the first insulating sheet may include a transparent area replacing the window. The electronic element is then placed entirely or partially on this area instead of being inserted into a window. The adhesive protection film remains still necessary to prevent that filling material flows by capillarity under the part of the electronic element placed on the transparent area.

The invention claimed is:
1. A method for manufacturing an electronic device comprising at least first and second insulating sheets having exter- nal and internal faces, at least one electronic element having an external face substantially flushing with the external face of said first insulated sheet and an internal module located between said first and second insulating sheets and connected to the electronic element, this method comprising the steps of:

placing at least said first insulating sheet including at least one window intended to lodge all or part of said electronic element;

inserting at least a part of the electronic element into said window of the first insulating sheet, the electronic element being provided with connection conductive areas positioned on an internal face opposite to the external face of the electronic element;

stacking on or over the internal face opposite to the external face of the electronic element an adhesive protection film closing at least a region between the electronic element and the edges of said window, said adhesive protection film being coated or made up of an adhesive substance;

placing an internal module on or over said first insulating sheet, said electronic element being connected to the internal module through a preformed opening in the adhesive protection film or an opening made during this step in the adhesive protection film, this opening facing the conductive connection areas;

providing filling material on the intermediate assembly resulting from the preceding steps;

stacking at least said second insulating sheet on or over the filing material and at least one of pressing and laminating the assembly resulting from the preceding steps, the filling material forming a layer compensating the surface reliefs of said intermediate assembly.

2. The method of claim 1 wherein the outline of the window of the first insulating sheet substantially adapts to the outline of the part of the electronic element inserted in the window.

3. The method of claim 1 wherein the outline of the window of the first insulating sheet substantially adapts to the outline of the electronic element entirely inserted in the window.

4. The method of claim 1 wherein the dimensions of the outline of the electronic element are constant on the whole thickness of said electronic element.

5. The method of claim 1 wherein the dimensions of the outline of the electronic element vary with the thickness of said electronic element.

6. The method of claim 5 wherein the electronic element is made up of at least two stacked stages, each stage having given dimensions of the outline and a given thickness.

7. The method of claim 4, wherein the electronic element is thicker than the first insulating sheet, several insulating sheets being stacked, with the outlines of the windows of each sheet coinciding, and the total thickness of the stack being substantially equal to the thickness of the electronic element, the adhesive protection film being placed on the stack by covering at least the outline of the window of the last sheet of the stack.

8. The method of claim 6, wherein the electronic element is thicker than the first insulating sheet, several insulating sheets being stacked, with the outlines of the windows of each sheet adapted to the outline of each stage of the electronic element, and the total thickness of the stack being substantially equal to the thickness of the electronic element, the adhesive protection film being placed on the stack by covering at least the outline of the window of the last sheet of the stack.

9. The method of claim 4, wherein the electronic element is thicker than the first insulating sheet, the adhesive protection film being placed on the electronic element in such a way as to also extend over the outline of the window of said first sheet, and wherein supplementary sheets each provided with a window are stacked, the outline of the windows of each supplementary sheet coinciding with the outline of the window of the first sheet, and the thickness of the assembly of sheets is substantially equal to the thickness of the electronic element.

10. The method of claim 6, wherein the electronic element is thicker than the first insulating sheet, the adhesive protection film being placed on the electronic element in such a way as to also extend over the outline of the window of said first sheet, and wherein supplementary sheets each provided with a window are stacked, the outline of the windows of each supplementary sheet being adapted to the outline of each stage of the electronic element, and the thickness of the assembly of sheets is substantially equal to the thickness of the electronic element.

11. The method of claim 1, wherein the filling material is provided on the adhesive film, the first insulating sheet and the internal module to form a layer compensating the surface reliefs to coat the internal module.

12. The method of claim 1, further comprising a step of lifting up the internal module and providing the filling material under the internal module, and a step of putting down the internal module onto the previously provided filling material.

13. The method of claim 12, further comprising a step of providing additional filling material on the internal module after putting down said internal module.

14. The method of claim 1 comprising a step of connecting the conductive connection areas of the electronic element to the internal module succeeding the step of placing the internal module in the area close to the window.

15. The method of claim 1, wherein the internal module includes connections ending on the internal face of the electronic element and facing the conductive connection areas.

16. The method of claim 1, wherein, prior to stacking the adhesive protection film on the assembly formed by the first insulating sheet and the electronic element, the internal module is placed on said adhesive protection film and the assembly formed by the protection film and the internal module is applied onto the assembly formed by the first insulating sheet and the electronic element.

17. The method of claim 1 wherein the opening of the adhesive protection film is defined by at least one preformed window.

18. The method of claim 1, wherein at least the first insulating sheet includes a cavity, the outline of said cavity being adapted to the outline of the internal module placed at least partially in said cavity.

19. The method of claim 1, comprising a further step of applying an additional transparent insulating sheet against the face of the electronic device including the window in which the electronic element is lodged.

20. A method for manufacturing an electronic device comprising the steps of:

placing at least a first insulating sheet including at least one window intended to lodge finally an electronic element;

inserting at least a part of an inert core into said window of the first insulating sheet;

stacking an adhesive protection film closing a region between the inert core and the edges of said window, said adhesive protection film being coated or made up of an adhesive substance, placing an internal module on or over said first insulating sheet, said internal module being electrically linked to conductive connection areas positioned on an internal face of the inert core, through a preformed opening of the adhesive protection film or an opening made in this protection film, providing filling material on the intermediate assembly resulting from the preceding steps, stacking at least a second insulating sheet on the filling material, pressing or laminating the assembly resulting from the preceding steps, the filling material forming a layer compensating the surface reliefs of said intermediate assembly, and removing the inert core from the window so that a cavity is provided, said cavity having a shape substantially corresponding to said electronic element and a bottom where the conductive connection areas are lying.

21. The method of claim 20 wherein the dimensions of the outline of the inert core are constant on the whole thickness of said inert core.

22. The method of claim 20 wherein the dimensions of the outline of the inert core decrease proportionally to the thickness of said inert core, the dimensions of the outline of the internal face of the core being smaller than the ones of the outline of the opposite face of the inert core inserted in the window of the first insulating sheet.

23. The method of claim 22 wherein the inert core is made up of at least two stacked stages, each stage having given dimensions of the outline and a given thickness.

24. The method of claim 21, wherein the inert core is thicker than the first insulating sheet, several insulating sheets being stacked, with the outlines of the windows of each sheet coinciding, and the total thickness of the stack being substantially equal to the thickness of the inert core, the adhesive protection film being placed on the stack by covering at least the outline of the window of the last sheet of the stack.

25. The method of claim 22, wherein the inert core is thicker than the first insulating sheet, several insulating sheets being stacked, with the outlines of the windows of each sheet adapted to the outline of each stage of the inert core, and the total thickness of the stack being substantially equal to the thickness of the inert core, the adhesive protection film being placed on the stack by covering at least the outline of the window of the last sheet of the stack.

26. The method of claim 21, wherein the inert core is thicker than the first insulating sheet, the adhesive protection film being placed on the inert core in such a way as to also extend over the outline of the window of said first sheet, and wherein supplementary sheets each provided with a window are stacked, the outline of the windows of each supplementary sheet coinciding with the outline of the window of the first sheet, and the thickness of the assembly of sheets is substantially equal to the thickness of the inert core.

27. The method of claim 23, wherein the inert core is thicker than the first insulating sheet, the adhesive protection film being placed on the inert core in such a way as to also extend over the outline of the window of said first sheet, and wherein supplementary sheets each provided with a window are stacked, the outline of the windows of each supplementary sheet being adapted to the outline of each stage of the inert core, and the thickness of the assembly of sheets is substantially equal to the thickness of the inert core.

28. The method of claim 20, wherein the filling material is provided on the adhesive film, the first insulating sheet and the internal module to form a layer compensating the surface reliefs and covering the internal module.

29. The method of claim 20, further comprising a step of lifting up the internal module and providing a part of filling material under the internal module, and a step of putting down the internal module onto this part of filling material.

30. The method of claim 29, further comprising a step of providing additional filling material on the internal module after putting down said internal module.

31. The method of claim 20 comprising a step of connecting the conductive connection areas positioned on the internal face of the inert core to the internal module succeeding the step of placing the internal module on or over the first insulating sheet.

32. The method of claim 20, wherein the internal module includes electrical connections ending on the internal face of the inert core, said electrical connections forming the conductive connection areas on the bottom of the cavity when the inert core is removed.

33. The method of claim 20, wherein, prior to stacking the adhesive protection film on the assembly formed by the first insulating sheet and the inert core, the internal module is placed on said adhesive protection film and the assembly formed by the protection film and the internal module is applied onto the assembly formed by the first insulating sheet and the inert core.

34. The method of claim 20, wherein the opening of the adhesive protection film is defined by a preformed window facing the internal face of the inert core where the conductive connection areas are positioned.

35. The method of claim 20, wherein at least the first insulating sheet includes a cavity, the outline of said cavity being adapted to the outline of the internal module placed at least partially in said cavity.

36. The method of claim 20, comprising, after removing the inert core from the window, an additional step of inserting said electronic element into the cavity in a fixed or a removable manner so that this electronic element is electrically linked to the conductive connection areas on the bottom of the cavity and thus to the internal module.

37. An electronic device manufactured according to the method of claim 1, comprising:

an assembly of at least first and second insulating sheets and at least one electronic element, said first insulating sheet including at least one window in which the electronic element is at least partially lodged, one external face of said electronic element flushing with the external face of said first insulating sheet, an internal module located between the two insulating sheets, a layer of filling material, an adhesive protection film extending over a region covering at least the outline of said window of said first insulating sheet, said protection film being situated between the first insulating sheet and the layer of filling material covering the protection film and the internal module, and conductive connection areas electrically linked to the internal module through an opening of the protection film and positioned on an internal face opposite to the external face of the electronic element, said conductive connection areas being part of said electronic element or in electrical contact with it.

38. The electronic device of claim 37, wherein the filling material substantially fully coats the internal module.

39. The electronic device of claim 37, wherein the opening through the adhesive protection film is defined by a preformed window facing said conductive connection areas.

40. The electronic device of claim 37, further comprising an additional transparent sheet covering the external face of the first insulating sheet including at least partially the window in which the electronic element is lodged.

* * * * *